(12) United States Patent
Ali et al.

(10) Patent No.: US 8,796,583 B2
(45) Date of Patent: Aug. 5, 2014

(54) METHOD OF FORMING A STRUCTURED SURFACE USING ABLATABLE RADIATION SENSITIVE MATERIAL

(75) Inventors: M. Zaki Ali, Mendota Heights, MN (US); Elsie A. Fohrenkamm, St. Paul, MN (US); Richard R. Ollmann, Jr., Woodbury, MN (US); Gregory L. Zwadlo, Ellsworth, WI (US)

(73) Assignee: Eastman Kodak Company, Rochester, NY (US)

( * ) Notice: Subject to any disclaimer, the term of this patent is extended or adjusted under 35 U.S.C. 154(b) by 3181 days.

(21) Appl. No.: 10/944,586

(22) Filed: Sep. 17, 2004

(65) Prior Publication Data
US 2006/0063111 A1    Mar. 23, 2006

(51) Int. Cl.
B23K 26/00    (2014.01)

(52) U.S. Cl.
USPC ............. 219/121.69; 219/121.68; 219/121.85

(58) Field of Classification Search
USPC ........................... 219/121.69, 121.68, 121.85
See application file for complete search history.

(56) References Cited

U.S. PATENT DOCUMENTS

| | | | |
|---|---|---|---|
| 2,848,462 A | 8/1958 | Gutzwiller-Markees et al. | |
| 3,769,019 A | 10/1973 | Wiese et al. | |
| 4,081,278 A | 3/1978 | Dedinas et al. | |
| 4,977,134 A | 12/1990 | Jongewaard et al. | |
| 5,380,644 A | 1/1995 | Yonkoski et al. | |
| 5,399,459 A | 3/1995 | Simpson et al. | |
| 5,460,921 A | 10/1995 | Cywar et al. | |
| 5,575,016 A | 11/1996 | Bailey | |
| 5,641,608 A * | 6/1997 | Grunwald et al. | 430/302 |
| RE35,550 E | 7/1997 | Jongewaard et al. | |
| 5,698,366 A | 12/1997 | Tutt et al. | |
| 5,935,758 A | 8/1999 | Patel et al. | |
| 6,074,893 A | 6/2000 | Nakata et al. | |
| 6,375,871 B1 | 4/2002 | Bentsen et al. | |
| 6,455,209 B1 | 9/2002 | Okaniwa et al. | |
| 6,609,459 B1 * | 8/2003 | Figov | 101/150 |
| 6,610,552 B2 | 8/2003 | Fujimori et al. | |
| 6,664,020 B1 | 12/2003 | Warner et al. | |
| 6,928,926 B2 * | 8/2005 | Koifman et al. | 101/150 |
| 2002/0051930 A1 * | 5/2002 | Ozawa et al. | 430/270.1 |
| 2003/0059987 A1 | 3/2003 | Sirringhaus et al. | |
| 2003/0211643 A1 * | 11/2003 | Fujimori et al. | 438/22 |

FOREIGN PATENT DOCUMENTS

| | | |
|---|---|---|
| EP | 0 679 052 | 10/1995 |
| EP | 0 739 748 | 10/1996 |
| EP | 0 602 893 | 8/1997 |
| EP | 1 061 383 | 12/2000 |
| EP | 1 226 974 | 7/2002 |
| WO | WO 9012342 | 3/1990 |
| WO | WO 97/44203 | 11/1997 |
| WO | WO 99/03688 | 1/1999 |
| WO | WO 02/49842 | 6/2002 |

\* cited by examiner

*Primary Examiner* — Alexandra Elve
(74) *Attorney, Agent, or Firm* — Nelson Adrian Blish

(57) ABSTRACT

A structured surface is formed with the method of the present invention. The method of making this structured surface includes the steps of applying an ablatable radiation sensitive coating on the major surface of the substrate, and exposing the ablatable radiation sensitive coating to radiation such that exposed portions of the ablatable radiation sensitive coating ablate from the substrate to form a structured surface. The structured surface then includes a substrate and a pattern of structures framed by at least one separation bank. The method may also include the steps of depositing a flowable material on to the structures and the separation bank to form a pattern of flowable material in the structures.

5 Claims, 5 Drawing Sheets

METHOD OF FORMING A STRUCTURED SURFACE USING ABLATABLE RADIATION SENSITIVE MATERIAL

BACKGROUND

Structured surfaces that contain flowable materials in specific patterns have proven to be useful in a variety of applications. For example, radio frequency identification (RFID) tags, cellular telephones and computers often contain flexible electrical micro-circuit boards that are formed by depositing a metallic nano-paste into a structured surface. Color filters, used in television screens, are formed by depositing specifically colored inks onto a structured surface so that the inks are contained in a specific area. Although these products have varying applications and uses, all begin with a structured surface that has the ability to contain a flowable material within a defined area. Thus, there has been a great deal of research done to devise processes that efficiently manufacture highly resolved structured surfaces.

One known method of forming structured surfaces utilizes photolithography. This method requires the steps of covering a photosensitive resin with a mask, blanket exposing the photosensitive resin to ultraviolet radiation, and then further developing the exposed photosensitive resin. A method of forming an integrated circuit using photolithography is reported in U.S. patent application No. 2003/0059987 to Sirringhaus. A method of forming a color filter using this method is reported in U.S. Pat. No. 6,455,209 to Okaniwa et al. A method of forming an electro-luminescent (EL) element using this method is reported in U.S. Pat. No. 6,610,552 to Fujimori et al.

Another known method of forming structured surfaces utilizes an etching process. In this method a photosensitive resin is applied to a layer of metal on a substrate. The photosensitive resin is then lithographically imaged, as described above, so as to expose certain areas of the metal layer underneath the photosensitive resin. The exposed areas of the metal layer is then removed by bathing the entire assembly in an etchant. In this method, the photosensitive resin acts as a resist for the metal layer. A method of forming a color filter using this etching method is reported in EP 1 061 383 to Seiko Epson.

Structured surfaces may also be manufactured using a known thermal transfer process, as reported in EP 1 226 974 to Seiko Epson. In a thermal transfer process, a donor sheet and an image receiving element are placed in contact with each other so that when the donor sheet is exposed to infrared radiation, the transfer layer of the donor sheet transfers to the image receiving element, thus forming a structured surface on the image receiving element.

Still another method of forming structured surfaces involves molding a flowable polymer. In this method, the flowable polymer is brought in contact with a molding surface to form structured patterns. The flowable polymer is then solidified and separated from the molding surface. This method is reported in U.S. Pat. No. 6,375,871 to Bentsen et al.

SUMMARY OF INVENTION

The method of the present invention includes the steps of patternwise exposing an ablatable radiation sensitive coating to radiation such that the exposed portions of the ablatable radiation sensitive coating ablate from the substrate to form structures and separation banks.

The term "structure" as used in this application refers to the space that is created when an exposed portion of the ablatable coating is removed from the substrate. Each structure includes at least one sub-component which is a structure floor.

The term "separation bank" as used in this application refers to the ablatable radiation sensitive coating that is not exposed to radiation and remains on the substrate. The separation bank functions to contain flowable material in the structures and also to prevent flowable material from migrating from one structure to another structure. The separation bank may also include sub-components, such as structure walls and an exposed bank surface.

In forming structured surfaces using the method of the present invention, several advantages are realized, for example unlike the lithographic and etching methods described above, the method of the present invention does not require the step of applying a mask. Rather, the present invention may utilize a direct-write method of exposure in which computer controlled laser radiation is projected at the ablatable coating. In this way, the laser both confers a specific pattern of exposure onto the coating and induces ablation in the portions of the coating that are exposed to radiation. In another example, since the structures are formed via ablation, the step of developing the exposed coating is eliminated. In the method of the present invention the materials and time required to apply the mask to the coating and to develop the exposed coating are eliminated, thus making the method of the present invention more efficient than the lithographic method. Eliminating these steps also makes it possible to form a continuous roll of structured surfaces making the method of the present invention more conducive to high throughput manufacturing than methods that use lithography. Finally, by using a coating on top of a substrate, rather than using a single type of flowable material to mold a structured surface, different wettability properties may be conferred to the different sub-components of the structures and separation banks.

The method of the present invention may also include additional steps such as depositing a flowable material onto the structured surface, heating the flowable material in the structures form a pattern of non-flowable material in the structures, or removing the separation banks to leave the pattern of non-flowable material on the substrate.

Figure 1A:
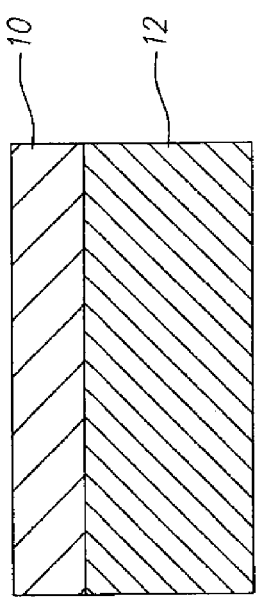
FIGS. 1(a)-(h) schematically illustrate one embodiment of the invention that includes.
Figure 1B:
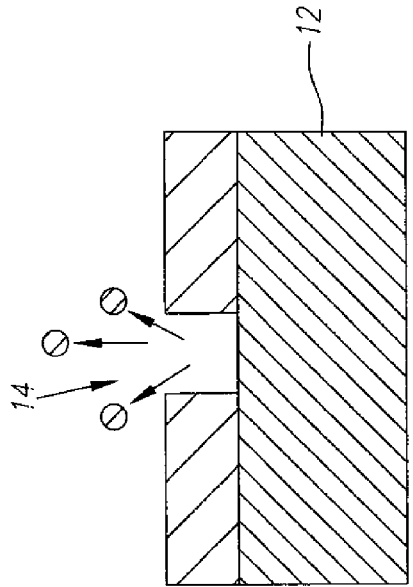
Figure 1C:
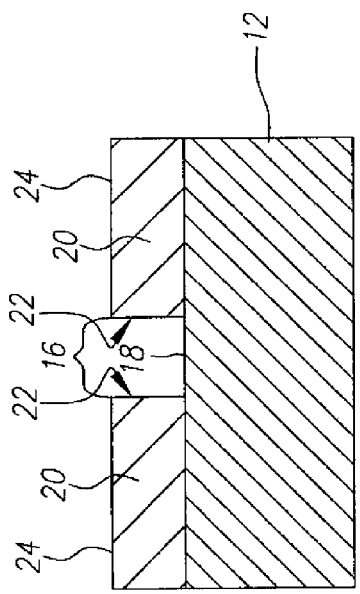
Figure 1D:
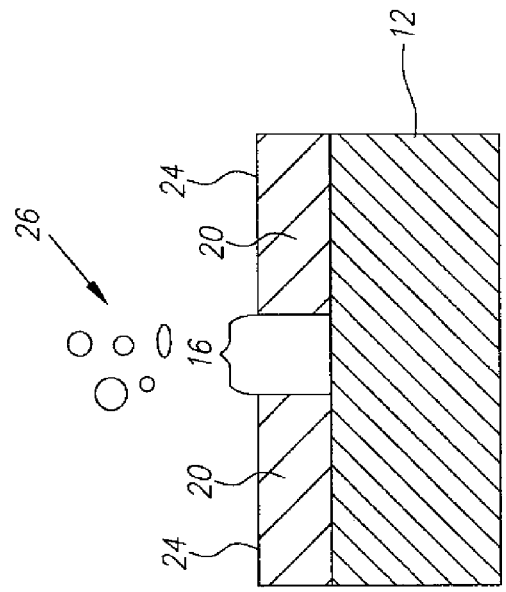
Figure 1E:
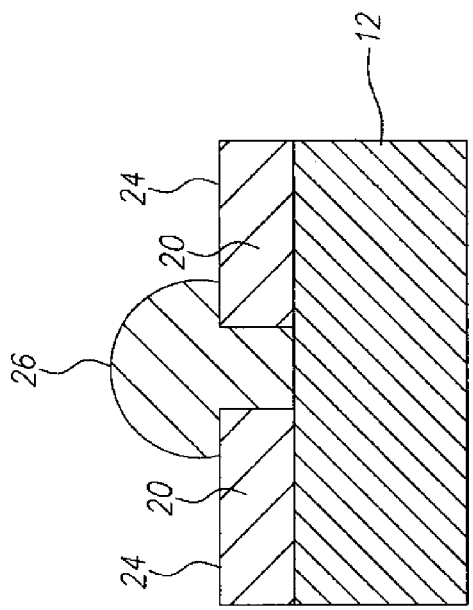
Figure 1F:
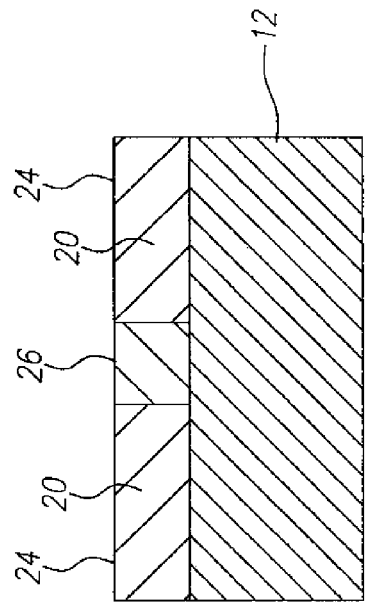
Figure 1G:
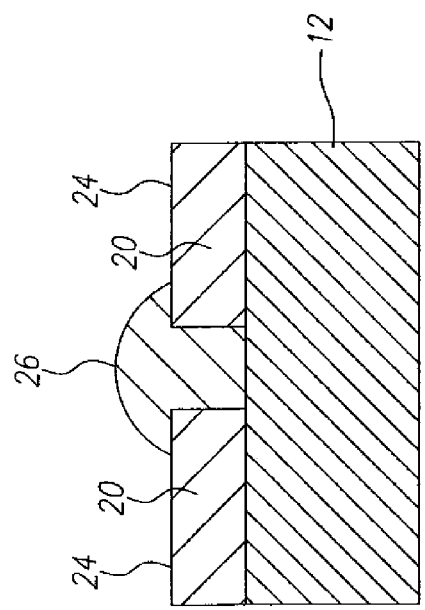

applying an ablatable radiation sensitive coating to a substrate to form a layer of ablatable radiation sensitive coating on the substrate, as illustrated in FIG. 1(a);

patternwise exposing the ablatable radiation sensitive coating to radiation, as illustrated in FIG. 1(b), so that the exposed portions of the coating ablate from the substrate to form structures framed by separation banks, as illustrated in FIG. 1(c); and depositing a flowable material onto the structures and the separation banks, as illustrated in FIG. 1(d), to form a pattern of flowable material contained in the structured surface, as illustrated in FIGS. 1(e)-1(h).

Figure 2B:
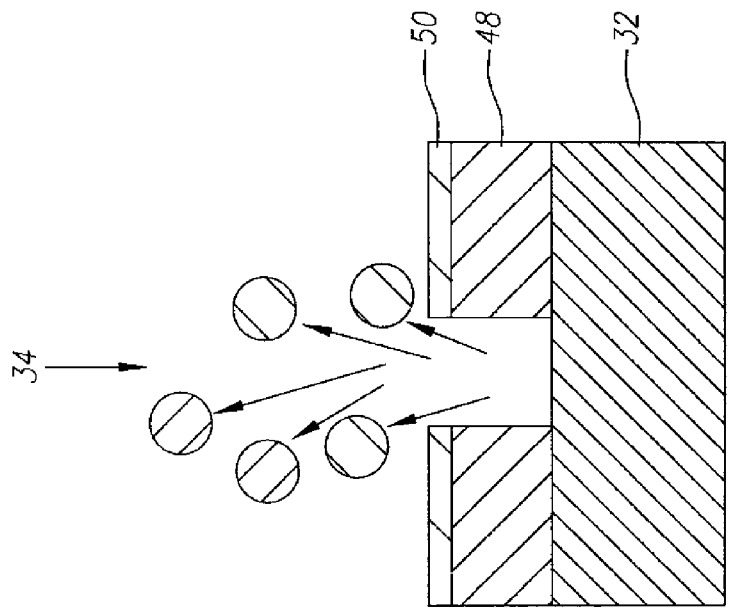
Figure 2A:
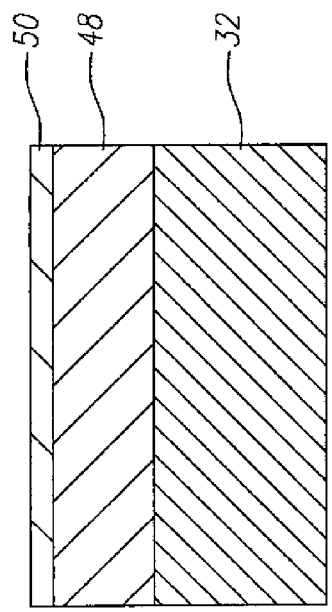
Figure 2D:
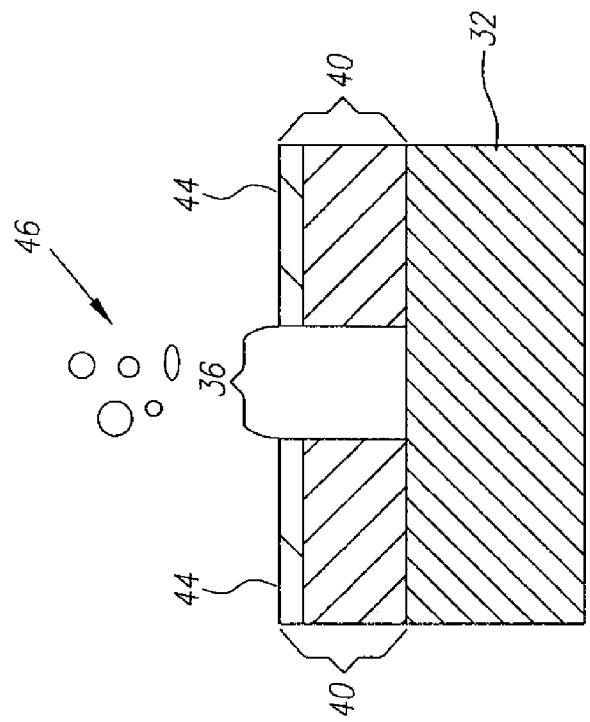
Figure 2C:
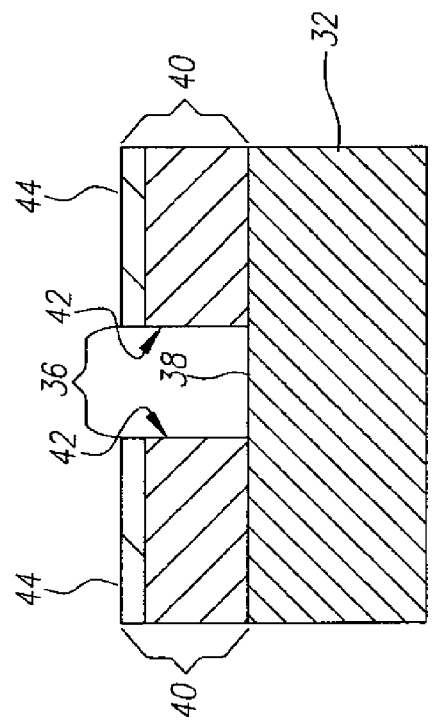
Figure 2E:
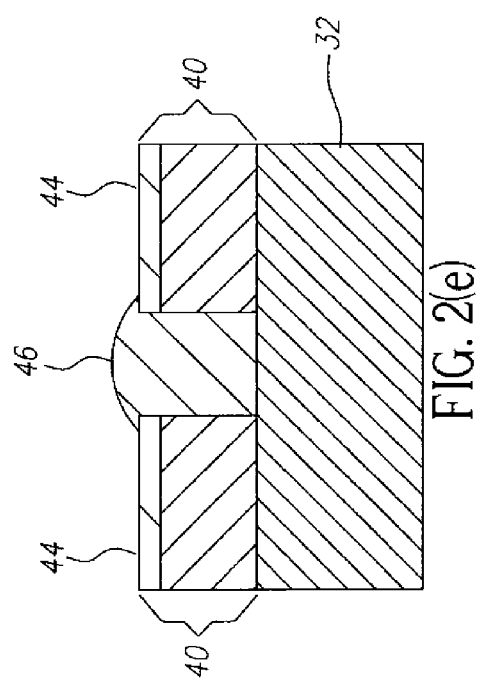
Figure 2F:
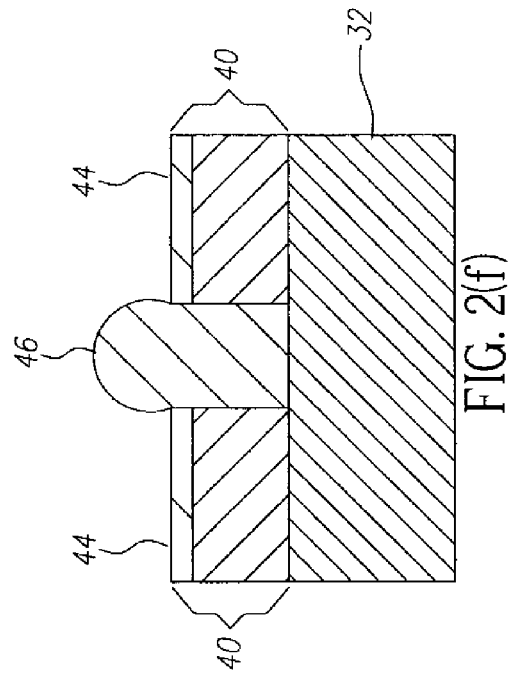
Figure 2G:
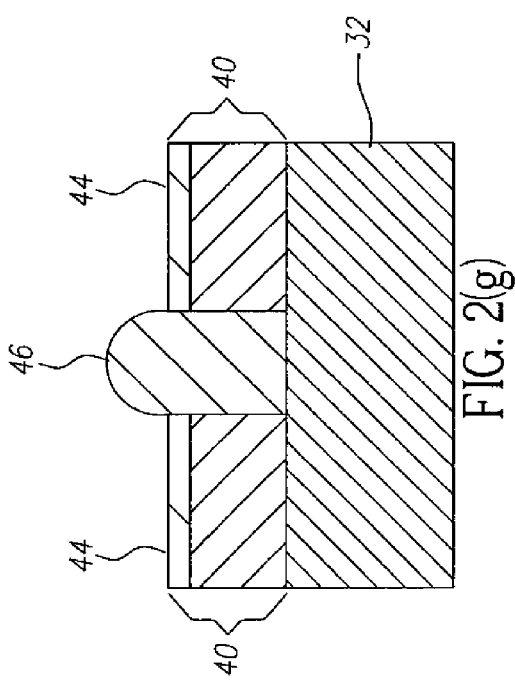

FIGS. 2(a)-(h) schematically illustrate an another embodiment of the invention that includes:

applying a first ablatable radiation sensitive coating to the substrate and applying a second ablatable radiation sensitive coating to the first ablatable radiation sensitive coating to form two layers of ablatable radiation sensitive coating on the substrate, as illustrated in FIG. 2(a);

patternwise exposing the first and second ablatable radiation sensitive coatings to radiation, as illustrated in FIG. 2(b), so that the exposed portions of the coatings ablate from the substrate to form structures framed by separation banks, as illustrated in FIG. 2(c);

depositing a flowable material onto the structures and the separation banks, as illustrated in FIG. 2(d), to form a pattern of flowable material contained in the structured surface, as illustrated in FIGS. 2(e)-2(h).

DETAILED DESCRIPTION

To form a structured surface on a substrate using the method of the present invention, an ablatable radiation sensitive coating is applied to a major surface of a substrate, and the ablatable radiation sensitive coating is patternwise exposed to radiation such that exposed portions of the ablatable radiation sensitive coating ablate to form structures framed by at least one separation bank.

Once structures are formed on the substrate, additional steps may be performed to create a variety of intermediate assemblies and finished articles. For example, a flowable material may be deposited on the structures and the separation bank. With this step, the flowable material may be contained in the structures to form a pattern of flowable material in the structures. Depending on the type of flowable material used, the pattern may then be used in various applications. For example, a color filter may be formed by depositing ink into the structures. By applying a metallic nano-paste to the structures, a flexible circuit board may be formed. A biological material may be deposited into the structures to perform biological analysis in the structures.

Applying an Ablatable Radiation Sensitive Coating to a Substrate

In one step of the invention, an ablatable radiation sensitive coating is applied to the substrate. The ablatable radiation sensitive coating is capable of ablating from the substrate upon exposure to radiation.

The ablatable radiation sensitive coating is generally applied to a major surface of the substrate as a relatively uniform coating (i.e., substantially continuous and having a fairly uniform thickness). In some embodiments, the ablatable radiation sensitive coating is applied to the substrate in one layer. As illustrated in FIG. 1(a), this results in one layer of ablatable radiation sensitive coating 10 disposed on the substrate 12. In other embodiments, the ablatable radiation sensitive coating is applied in more than one layer. In a particular embodiment, a first ablatable radiation sensitive coating is applied to the substrate and a second ablatable radiation sensitive coating is applied to the first ablatable radiation sensitive coating. As illustrated in FIG. 2(a), this results in a layer of the first ablatable radiation sensitive coating 48 on the substrate 32, and the second ablatable radiation sensitive coating 50 disposed on the first ablatable radiation sensitive coating 48.

Ablatable Radiation Sensitive Coating

The ablatable radiation sensitive coating may include a variety of components. The components should be selected so that the ablatable radiation sensitive coating is able to ablate from the substrate upon exposure to radiation. For example, in one embodiment the ablatable radiation sensitive coating includes a binder and an infrared absorbing compound. In another embodiment, the ablatable radiation sensitive coating includes a binder, an infrared absorbing compound, and a polymeric fluorocarbon that serves as a repelling material. In still another embodiment, the ablatable radiation sensitive coating includes a binder and an ultraviolet absorbing compound. In yet another embodiment, the ablatable radiation sensitive coating includes a binder, an infrared absorbing compound, and a wetting agent. Other embodiments may also be formed using suitable components.

If the ablatable radiation sensitive coating is applied in more than one layer, the two layers may include different components. For example, in one embodiment, a first radiation sensitive coating may include a binder, an infrared absorbing compound, and a wetting agent while a second radiation sensitive coating may include a binder, an infrared absorbing compound and a low surface energy material. By excluding the low surface energy material from the first radiation sensitive coating, the structure walls formed in the present invention will be capable of wetting a flowable material. In another embodiment, the first radiation sensitive coating may include, for example, a binder, an infrared absorbing dye, a wetting agent, and a visualizing dye while the second ablatable radiation sensitive coating includes a polymeric binder, an infrared absorbing dye, and a low surface energy material.

Binder

The ablatable radiation sensitive coating may include a binder. Suitable binders are capable of dissolving or dispersing the other components included in the ablatable radiation sensitive coating. Binders that decompose upon exposure heat to rapidly generate a gas are especially suitable in the ablatable radiation sensitive coating to confer this property into the ablatable radiation sensitive coating. A binder that provides adhesion to the major surface of the substrate may also be desired.

The binder is typically present in an amount of about 25 wt.-% to about 75 wt.-%, and more suitably in an amount of about 35 wt.-% to about 65 wt.-%, based on the solids content of the ablatable radiation sensitive coating.

A wide variety of binders may be suitable in the practice of the invention. The binder should be compatible with the other selected components of the ablatable radiation sensitive coating, and should be soluble in a suitable coating solvent such as lower alcohols, ketones, ethers, hydrocarbons, haloalkanes and the like. For example, the binder may be a polymeric material that contains a plurality of hydroxy groups (i.e., a "hydroxylic polymer"). In one embodiment, 100% of the binder is a hydroxylic polymer. The hydroxy groups may be alcoholic groups or phenolic groups, or both. A hydroxylic polymer may be obtained by polymerization or copolymerization of hydroxy-functional monomers such as allyl alcohol and hydroxyalkyl acrylates or methacrylates, or by chemical conversion of preformed polymers, e.g., by hydrolysis of polymers and copolymers of vinyl esters such as vinyl acetate. Polymers with a high degree of hydroxy functionality, such as poly(vinyl alcohol), cellulosic materials, etc., are also suitable for use in the invention. Derivatives of such polymers, obtained by esterification, etherification, or acetalization of the bulk of the hydroxy groups, generally exhibit superior solubility and film-forming properties, and are suitable for use in the invention. Particular examples of suitable cellulosic materials for use in the binder include cellulose acetate butyrate and nitrocellulose, cellulose acetate hydrogen phthalate, cellulose acetate, cellulose acetate propionate, cellulose acetate butyrate, cellulose triacetate or any of the cellulosic binders described in U.S. Pat. No. 4,700,207 to Vanier et al.

One suitable hydroxy-functional polymer for use as the binder is a reaction product formed by reacting poly(vinyl alcohol) with butyraldehyde. Commercial grades of this reaction product typically dissolve in common organic solvents and possess excellent film-forming and pigment-dispersing properties.

A commercially available hydroxylic polymer that is suitable is a polyvinyl butyral polymer available under the trade designation BUTVAR B-76 from Solutia, Inc. (St. Louis, Mo.). Other hydroxylic binders from the BUTVAR series of polymers may also be used. Polyvinyl butyral polymers available under the trade designations MOWITAL from Kuraray America, Inc. (New York, N.Y.) are also suitable. An example of a suitable commercially available binder that may be combined with the hydroxylic binders described above in the ablatable radiation sensitive coating includes poly(methyl methacrylate)s available under the trade designation ELVACITE from DuPont (Wilmington, Del.).

Other suitable binders include, for example, polyesters, polyamides, polyacetals, polycarbamates, polycarbonates, such as polypropylene carbonate, polyolefins, polystyrenes such as polyalphamethylstyrene, polyethers, polyvinyl ethers, polyvinyl esters, poly(vinyl chloride), polyurethanes, polyorthoesters, polyacrylates, polymethacrylates, acrylonitrile and substituted acrylonitrile polymers, maleic acid resins, polysulfones or poly(phenylene oxide)s, and the like.

Infrared Absorbing Compounds

In one embodiment, the ablatable radiation sensitive coating is sensitive to infrared radiation. In this embodiment, the ablatable infrared radiation sensitive coating may include an infrared absorbing compound. Absorption of infrared radiation by the infrared absorbing compound creates heat which initiates a physical or chemical change in the other components of the ablatable infrared sensitive coatings resulting in ablation of the ablatable infrared sensitive coating off of the major surface of the substrate. Examples of infrared absorbing compounds include infrared absorbing dyes, described below, and infrared absorbing pigments such as carbon black.

In some embodiments, the infrared absorbing dye is a cationic dye. Suitable cationic dyes for use in the ablatable radiation sensitive coating include tetraarylpolymethine (TAPM) dyes, amine cation radical dyes, and mixtures thereof. Particularly suitable infrared absorbing dyes in the present invention are tetraarylpolymethine dyes. Dyes of these classes are typically stable when formulated with the other components of the ablatable radiation sensitive coating, and absorb in the correct wavelength ranges for use with the commonly available infrared laser sources.

TAPM dyes comprise a polymethine chain having an odd number of carbon atoms (5 or more), each terminal carbon atom of the chain being linked to two aryl substituents. TAPM dyes generally absorb in the 700 nm-900 nm region, making them suitable for diode laser address. Suitable TAPM dyes are described, for example, in U.S. Pat. No. 5,935,758 to Patel, et al.

Suitable cationic infrared absorbing dyes also include the class of amine cation radical dyes reported, for example, in International Publication WO 90/12342, and in EP publication 0 739 748. Suitable cationic infrared absorbing dyes are also described in U.S. Pat. No. 5,935,758 to Patel, et al.

The infrared absorbing dye may be present in a sufficient quantity to provide a transmission optical density of at least about 0.5, more particularly, at least about 0.75, and most particularly, at least about 1.0, at the exposing wavelength. Typically, this is achieved with about 3 wt.-% to about 20 wt.-% infrared absorbing dye, based on the solids content of the ablatable radiation sensitive coating.

Ultraviolet Absorbing Compounds

In one embodiment, the ablatable radiation sensitive coating includes an ultraviolet absorbing dye. Examples of such dyes are reported in U.S. Pat. No. 3,769,019 to Weise, et al., U.S. Pat. No. 4,081,278 to Dedinas, et al. and, U.S. Pat. No. 5,399,459 to Simpson, et al. The ultraviolet absorbing compound may absorb radiation with a wavelength of between about 250 nm-600 nm, more typically between about 300 nm-500 nm. Examples of suitable ultraviolet absorbing compounds include dyes that marketed under the name UVINUL from BASF (Germany), and KEYPLAST YELLOW GC from Keystone Aniline Corporation (Chicago, Ill.).

Wetting Agents

In another embodiment, the ablatable radiation sensitive coating may include a wetting agent. If a wetting agent is included in the ablatable radiation sensitive coating, the separation banks formed by the method of this invention will include the wetting agent such that the flowable material will more easily wet or spread throughout the structures.

In one embodiment, the wetting agent includes a polymeric material. Examples of suitable polymeric wetting agents include gum arabic, gelatin, and cellulosic materials. In another embodiment, the wetting agent includes a particulate material. Examples of suitable particulate materials that may be used as wetting agents include alumina, clay, mica and fumed silica. Other examples of suitable wetting agents include silicates and phosphates.

Repelling Materials

The ablatable radiation sensitive material may also include a repelling material. The repelling material may include any suitable substance that is able to repel a flowable material that is applied to the structured surface. By including repelling materials in the ablatable coating, the resulting exposed bank surfaces of the separation banks are able to repel flowable material so that when flowable material is deposited onto the exposed bank surface, the flowable material will bead and move into the structures where it is contained by the separation banks.

One embodiment of the repelling material is a low surface energy material. Low surface energy materials work by imparting a low surface energy to the exposed bank surface of the separation banks described below. If the exposed bank surface has a lower surface energy than the surface tension of a flowable material, the exposed bank surface will repel the flowable material.

Examples of suitable repelling materials include polymeric materials, such as fluorine-containing resins and silicone-containing resins. In one embodiment, the repelling material is a fluorocarbon additive. A wide variety of compounds may be employed as a fluorocarbon additive, provided that the chosen additive is substantially involatile under normal coating and drying conditions, and is sufficiently compatible with the binder(s). Thus, highly insoluble fluorocarbons, such as polytetrafluoroethylene and polyvinylidenefluoride, are unsuitable, as are gases and low boiling liquids, such as perfluoralkanes. With the above restrictions, both polymeric and lower molecular weight materials may be used. Examples of suitable fluorocarbon additives are described in U.S. Pat. No. 5,935,758 to Patel, et al. The ablatable radiation sensitive coating may also include a fluorocarbon compound as described in U.S. Pat. No. 6,664,020 to Warner, et al. and U.S. Pat. No. 5,380,644 to Yonkoski, et al. Other suitable fluorocarbon compounds are reported in EP publication 0 602 893 and the references cited therein. A particular fluorocarbon additive is a sulfonamido compound N-ethyl perfluorooctanesulfonamide having the formula $(C_8F_{17})SO_2NH(CH_2CH_3)$, which includes 70% straight chains and 30% branched chains. Another suitable fluorocarbon includes a NOVEC fluorosurfactant available from 3M (St. Paul, Minn.), such as FC 4432.

The fluorocarbon additive is typically used in an amount of about 1 wt.-% to about 20 wt.-%, based on the dry coating weight of the ablatable radiation sensitive coating.

Latent Crosslinking Agent

A latent crosslinking agent may be employed in some embodiments of the ablatable radiation sensitive coating. As used herein, a "latent crosslinking agent" is a compound that is capable of causing crosslinking only under conditions of laser exposure. It is believed that during laser exposure, the latent crosslinking agent reacts with a photoexcited infrared absorbing compound or a photoexcited ultraviolet absorbing compound, which initiates crosslinking of the hydroxylic binder.

Suitable latent crosslinking agents include compounds derived from dihydropyridine, for example. Suitable derivatives of dihydropyridine can be substituted at any of the ring positions with appropriate substituents, such as alkyl or aryl groups. In particular, 3,5-dicarboxylic diester derivatives of dihydropyridine are suitable as latent crosslinking agents. Polymers comprising a 3,5-dicarboxylic diester derivative of dihydropyridine integrated into the polymer backbone may also be suitable. One example of a suitable commercially available dihydropyridine derivative includes HPA 1186 available from St. Jean Photochemicals, Inc., (Quebec, Canada). Latent crosslinking agents that are useful in the ablatable radiation sensitive coating are also described in U.S. Pat. No. 5,935,758 to Patel, et al.

This latent crosslinking agent is present in the ablatable radiation sensitive coating in an amount of up to about 30 wt.-%, based on the solids content of the imageable material.

Optional Components

Additional components such as, for example, plasticizers, coating aids, dispersing agents, fillers, etc., may also be incorporated into the ablatable radiation sensitive coating. The various additives are well known in the art.

For example, the ablatable radiation sensitive coating may include a visualizing agent. The visualizing agent generally comprises one or more dyes or pigments that will allow the resulting separation banks to be visible on the substrate. Suitable visualizing agents for use in the ablatable radiation sensitive coating include pigments, nonsublimable dyes, or sublimable dyes. Pigments and nonsublimable dyes are suitably employed because they do not tend to migrate. The use of pigment dispersions in imaging is well-known in the imaging art, and any conventional pigments useful for that purpose may be used in the present invention. The visualizing agent may be present in the ablatable radiation sensitive coating in an amount of about 2 wt.-% to about 10 wt.-%, based on the solids content of the ablatable radiation sensitive coating.

Other optional components of the ablatable radiation sensitive coating include, for example, a dispersing agent. Dispersing agents, or "dispersants," may be desirable to achieve optimum dispersion quality. Some examples of dispersing agents include, for example, polyester/polyamine copolymers, alkylarylpolyether alcohols, acrylic binders, and wetting agents. One suitable dispersant in the ablatable radiation sensitive coating is a block copolymer with pigment-affinic groups, which is available under the trade designation DISPERBYK 161 from Byk-Chemie USA (Wallingford, Conn.). The dispersing agent may be present in an amount of about 1 wt.-% to about 6 wt.-%, based on the solids content of the ablatable radiation sensitive coating.

A wide variety of surfactants may also be used in the ablatable radiation sensitive coating to improve solution stability. One example of a suitable surfactant is FC 55/35/10, available from 3M (St. Paul, Minn.). A suitable quantity of surfactant may be in the range of about 0.05 to 5 wt.-%, more particularly the range of about 1 to 2 wt.-%, based on the solids content of the ablatable radiation sensitive coating.

Application of the Ablatable Radiation Sensitive Coating to the Substrate

The substrate may be formed of any suitable material in any suitable shape. Typically, the substrate is a sheet or film of polymeric material. In one embodiment, the substrate is a film of polyimide, such as DUPONT HN polyimide substrate, available from DuPont, Wilmington, Del. In another embodiment, the substrate is a film of polyester, such as, DUPONT 574 polyester, also available from DuPont, Wilmington, Del. Other substrates may also be suitable.

The ablatable radiation sensitive coating may be applied to a major surface of the substrate using any suitable technique. For example, the components used in the ablatable radiation sensitive coating described above may be dissolved in a suitable solvent to create a solution of ablatable radiation sensitive coating that is coated onto the substrate. Suitable solvents include, for example, methyl ethyl ketone, propylene glycol methyl ether, ethanol, and other alcohols, or blends of these solvents. Suitable methods of coating the solution onto the major surface of the substrate include, for example, spin coating, bar coating, gravure coating and roller coating. Once the solution of ablatable radiation sensitive coating is applied to the major surface of the substrate, the solution may be dried or cured to form a film of ablatable radiation sensitive coating on the substrate. Drying or curing may be performed by heating the substrate and the solution of ablatable radiation sensitive coating coated on it. For example, the substrate coated with the solution of ablatable radiation sensitive coating may be placed into a heated oven until a film of the ablatable radiation sensitive coating forms on the substrate. The solution of ablatable radiation sensitive coating may also, for example, be allowed to air dry without heating.

As described above, the ablatable radiation sensitive coating may be applied in two layers. In this embodiment, the first ablatable radiation sensitive coating may be applied to the major surface of the substrate and the second ablatable radiation sensitive coating may be applied to the first radiation sensitive coating using any suitable method, such as those described above.

Patternwise Exposing the Ablatable Radiation Sensitive Coating to Radiation

The shape and resolution of the structures formed with the method of the present invention depend upon patternwise exposing the ablatable radiation sensitive coating to radiation. The radiation creates very intense, localized heating in the areas of the ablatable radiation sensitive coating that are exposed to radiation. The areas of the ablatable radiation sensitive coating where the radiation is projected is referred to as the exposed portions while the areas where radiation is not projected is referred to as the non-exposed portions.

Methods of patternwise exposing the ablatable radiation sensitive coating to radiation are conventional in the art. In some embodiments, exposure is accomplished using laser radiation from a laser that is flooded, flashed, scanned or rasterized under computer control. For example, a short pulse flashlamp, such as one described in U.S. Pat. No. 5,575,016 to Dunn et al. may be used to expose the ablatable radiation sensitive coating to radiation. Furthermore, any of the known scanning devices may be used, e.g., flat-bed scanners, external drum scanners, or internal drum scanners.

In one embodiment, the ablatable radiation sensitive coating is exposed to infrared radiation. The infrared radiation may have, for example, a wavelength in the range of about 750 nm to about 1200 nm. Infrared radiation may be provided, for example, by an infrared laser such as a diode laser that emits infrared radiation with a wavelength of about 830 nm or a Nd:YAG laser that emits radiation at a wavelength of about 1064 nm. Any other suitable infrared laser may be used. The infrared radiation may also be provided by a short pulse flashlamp. In this step, the infrared absorbing compound may, for example, convert infrared radiation to heat. The generation of heat in the exposed portions of the ablatable radiation sensitive coating may then result in a physical or chemical change in another component of the ablatable radiation sensitive coating which induces ablation.

Suitable infrared imagers include those infrared imagers used in proofing processes. Examples of such infrared exposure units include DESERTCAT 88 imager, available from ECRM (Tewksbury, Mass.). Infrared imagers for CTP lithographic plate applications, such as the TRENDSETTER 3230 imager, which contains a laser diode that emits near infrared radiation at a wavelength of about 830 nm, from Creo (Burnaby, British Columbia) and DIMENSION imager from Presstek (Hudson, N.H.) may also be used. Imagers configured for imaging flexographic articles, such as CYREL Digital Imager (CDI SPARK) manufactured by Esko-Graphics (Kennesaw, Ga.), THERMOFLEX imager by Creo (Burnaby, British Columbia), and OMNISETTER imager from Misomex International (Hudson, N.H.) could also be employed.

In another embodiment the ablatable radiation sensitive coating is exposed to visible radiation. The visible radiation may have, for example, a wavelength in the range of about 350 nm to about 750 nm. Examples of suitable visible imagers include argon ion lasers that emit radiation with a wavelength of 514 nm, and helium cadmium laser imagers that emit radiation with a wavelength of 442 nm.

In another embodiment the ablatable radiation sensitive coating is exposed to ultraviolet radiation. The visible radiation may have, for example, a wavelength in the range of about 180 nm to about 350 nm. Examples of suitable ultraviolet imagers include, for example, xenon chloride excimer lasers that emit radiation at about 308 nm, and bromide lasers. Other typical ultraviolet lasers may also be suitable.

The exposed areas of the ablatable radiation sensitive coating should correspond to the areas where structures will be formed. Thus, the radiation should be spatially distributed to create exposed portions of suitable width.

Ablation of the Ablatable Radiation Sensitive Coating from the Substrate

In one embodiment of the invention, the ablatable radiation sensitive coating ablates from the substrate upon exposure to radiation. Through an ablation mechanism, the exposed ablatable radiation sensitive coating is propelled from the substrate by generation of a gas. The build-up of gas under or within the exposed areas of the ablatable radiation sensitive coating creates pressure that propels the ablatable radiation sensitive coating off of the substrate in the exposed areas.

This embodiment is illustrated in FIGS. 1(b) and 2(b). FIG. 1(b) shows that when the ablatable radiation sensitive coating 10 is exposed to radiation 14, the exposed areas ablate from the substrate 12. Similarly, as illustrated in FIG. 2(b), when the first ablatable radiation sensitive coating 48 and the second ablatable radiation sensitive coating 50 is exposed to radiation 34, the exposed areas ablate from the substrate 32.

A suitable debris collector, such as, for example, a vacuum or a suitable receptor sheet may be used to collect the ablated debris that is propelled from the substrate. The vacuum or receptor sheet may be placed in any location suitable for retrieving debris after it is propelled from the substrate. The receptor sheet may be any material suitable for collecting the debris such as, for example, papers, transparent films, and metal sheets.

By ablating the exposed ablatable radiation sensitive coating, structures framed by at least one separation bank are formed on the substrate. The at least one separation bank functions to contain a flowable material in the structures. The at least one separation bank may be of any suitable height. In one embodiment, the at least one separation bank exhibits a height of about 0.3 microns to about 20 microns, more particularly about 0.5 microns to about 5 microns. The height of the separation banks largely depends upon the thickness of the ablatable radiation sensitive coating that was applied to the substrate.

Depending on the pattern of exposed and non-exposed portions of ablatable radiation sensitive coating, the separation bank may be one continuous bank with structures that are completely surrounded by the one separation bank. Alternatively, the pattern of exposed and non-exposed portions of the ablatable radiation sensitive coating may be such that one continuous separation bank is not formed. In this case, more than one separation bank may be formed on the substrate.

The resulting structures may be formed in any suitable shape such as, for example, channels or wells. The channels may be substantially parallel to each other, or they may be formed in an array of overlapping channels. The channels may have a width of less than about 30 microns, more particularly about 2-30 microns, even more particularly about 5-30 microns, and still more particularly about 20 microns.

The wells may be formed in any suitable shape suitable for containing a flowable material, such as angular or spherical shapes.

The resulting structures and separation banks may include several exposed surfaces, including a structure floor, structure walls and an exposed bank surface. The structure floor refers to the surface of the structure that is closest in distance to the major surface of the substrate. The structure floor may be formed of the exposed substrate, the residual ablatable radiation sensitive coating (i.e. the exposed ablatable radiation sensitive coating that was not removed from the substrate), or both exposed substrate and residual ablatable radiation sensitive coating.

The structure walls refer the exposed surfaces where the exposed portions of the ablatable radiation sensitive coating have ablated from the non-exposed portions. Thus the structure walls are formed in a plane that is not substantially parallel to the major surface of the substrate. In one embodiment, the structure walls include a wetting agent which promotes wetting of the structure by a flowable material. This is particularly useful if the structure is in the shape of a channel. Even if the structure is formed in the shape of a well, the structure walls that contain a wetting agent will enable the flowable material to wet the structure walls creating a more completely filled structure.

The exposed bank surface describes the major surface of the separation banks and is in a plane that is substantially parallel to the major surface of the substrate. In one embodiment, the exposed bank surface is capable of repelling a flowable material. For example, a repelling material, such as a low surface energy material, may be located at the exposed bank surface so that if a flowable material is deposited onto the exposed bank surface, the flowable material is repelled from the exposed bank surface and flows into the structures where it may be contained.

The structured surface that results from removing the exposed areas of the ablatable radiation sensitive coating from the substrate is illustrated in FIGS. 1(c) and 2(c). FIG. 1(c) illustrates a structure 16 framed by separation banks 20 on the substrate 12. The structure 16 includes a structure floor 18 while the separation banks 20 include an exposed bank surfaces 24 and structure walls 22. FIG. 2(c) similarly illustrates an embodiment in which a structure 36 and separation banks 40 result from exposing the first and second ablatable radiation sensitive coatings 48, 50 to radiation 34. The structure 36 includes a structure floor 38 while the separation banks 40 include structure walls 42 and exposed bank surfaces 44.

Treatment of the Structured Surface

In one embodiment, the structured surface may be treated before a flowable material is deposited on the structured surface. Any suitable treatment may be employed, such as, for example, washing with a developer to remove residual ablatable radiation sensitive coating from the structures.

In another embodiment the separation banks may be cured by subjecting the separation banks to heat, provided that properties of the separation banks and structures are not adversely affected by the heat. Heating may be done by a variety of means, such as storage in an oven, hot air treatment, contact with a heated platen or passage through a heated roller device. In other embodiments, heat treatment is not necessary for curing to take place. Curing the separation banks may allow the separation banks to crosslink, if a latent crosslinking agent is present in the ablatable radiation sensitive coating.

Depositing a Flowable Material onto the Structures and Separation Banks

In some embodiments, the method of the current invention may include the step of depositing a flowable material onto the structures and onto the at least one separation bank to form a first intermediate assembly. The first intermediate assembly refers to the assembly that includes a structured surface on a substrate, and a pattern of flowable material contained in the structures framed by the at least one separation bank of the structured surface. The first intermediate assembly may constitute the final article depending upon the type of finished article that is desired.

Figure 1H:
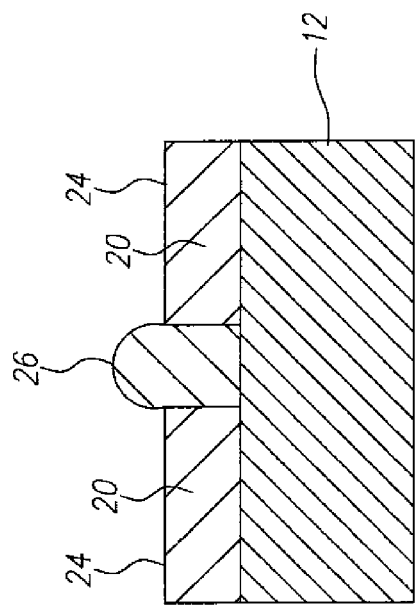
Figure 2H:
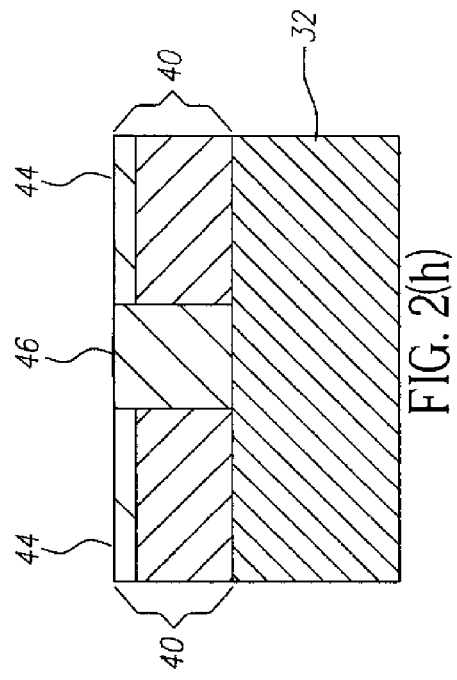

FIGS. 1(d) and 2(d) illustrate the step of depositing a flowable material 26, 46 onto the structure 16, 36 and onto the separation banks 20, 40. As illustrated in FIGS. 1(e)-1(h) and in FIGS. 2(e)-2(h), the flowable material may then wet the structure, particularly the structure walls and structure floor, so that the flowable material fills the structure to form a first intermediate assembly. Additionally, the exposed bank surfaces 24, 44 may repel the flowable material 26, 46, as illustrated in FIGS. 1(e)-1(f) and FIGS. 2(e)-2(f). As illustrated in these figures, flowable material 26, 46 that is deposited on the exposed bank surfaces 24, 44 is repelled from the exposed bank surfaces 24, 44 so that it flows into the structures where it is contained by the separation banks 20, 40. FIGS. 1(h) and 2(h) illustrate the first intermediate assembly in which the flowable material 26, 46 is contained in the structures framed by the separation banks 20, 40.

Flowable Material

The flowable material may include any suitable material that is suitable for the purpose of the structured surface. The type of flowable material deposited is determined by the intended finished article. In some embodiments, the flowable material is a gas. In another embodiment, the flowable material is a flowable solid, such as, for example, a powder. One example of a suitable flowable powder includes a toner.

In still another embodiment, the flowable material is a liquid. Suitable liquids include inks, including luminescent inks, and metallic nano-pastes. The metallic nano-paste may include metal particles dispersed in a solution. The metal particles may include particles of silver, copper, gold, aluminum or any other suitable metallic material. The solution used in formulating the metallic nano-paste should be selected to not substantially dissolve the separation banks.

One example of a commercially available metallic nano-paste includes NANOPASTE available from Harima Chem. Inc. (Osaka, Japan), Depositing Flowable Material In one embodiment, the flowable material is deposited onto the structures and onto the separation banks via patternwise ink-jet. Generally, patternwise ink-jet application of flowable materials may be substantially affected by the properties and/or behavior of the flowable material. For example, the viscosity and surface tension of an ink-jetted material may affect the ink-jet velocity, droplet size, droplet separation length, stream stability and other ink-jetting characteristics.

Commercially available ink-jet printers use various schemes to control the deposition of the flowable material. Such schemes are generally of two types, continuous stream or drop-on-demand. In drop-on-demand systems, the flowable material droplets are ejected from orifices directly to a position on the structured surface by pressure created by, for example, a piezoelectric device, an acoustic device, or a resistive heater controlled in accordance with digital signals. Thus, flowable material droplets are not generated and ejected through the orifices of the print head unless they are directed to do so by the digital signals. Continuous ink-jet printers produce smaller droplet sizes for a generally higher resolution, but the flowable materials must be conductive because the droplets are selectively deflected between the structures and a collection reservoir by implementing electrostatic deflectors.

Suitable ink-jet printers for patternwise application of the flowable material may include the JETPLATE ink-jet printer, available from Pisces-Print Imaging Sciences Inc. (Nashua, N.H.) the XAARJET EVALUATION KIT, Model No. XJ126R supplied by Xaarjet (Cambridge, UK) the Hewlett Packard DESKJET 970 CXI ink-jet printer, the Hewlett Packard 540C ink-jet printer, the Epson STYLUS COLOR 600 ink-jet printer, the Epson 740 ink-jet printer, the Epson 800 ink-jet printer, the Epson STYLUS COLOR 900 ink-jet printer, the Epson STYLUS PRO9600 ink-jet printer and the Epson STYLUS COLOR 3000 ink-jet printer.

Other suitable methods for depositing the flowable material onto the structured surface include coating processes, printing processes or controlled depositing processes such as, for example, application with a syringe.

Heating the First Intermediate Assembly to Form a Pattern of Non-Flowable Material in the Structures The method of the present invention may also include the step of heating the first intermediate assembly to form a second intermediate assembly. This step may be particularly suitable if, for example, the flowable material is a metallic nano-paste and the step of heating sinters the particles of metal together to form a circuit board. The second intermediate assembly includes a structured surface on a substrate and a pattern of non-flowable material in the structures of the structured surface. The second intermediate assembly may constitute the final article depending upon the type of finished article that is desired. The first intermediate assembly and the second intermediate assembly differ in that the first intermediate assembly includes flowable material in the structures that have not been heated while the second intermediate assembly includes a non-flowable material that has been heated.

The step of heating the first intermediate assembly to form a second intermediate assembly may be performed at any suitable temperature for any suitable time, depending upon the flowable material contained within the structures. For example, the first intermediate assembly may be placed in an 100-200 deg. C. oven for 10-60 minutes to form the second intermediate assembly. Other temperature ranges and times may also be suitable.

Removing the Separation Banks

The method of the present invention may also optionally include the step of removing the separation banks to form a finished article. The separation banks may be removed by bathing the second intermediate assembly or the first intermediate assembly in a suitable developer that does not substantially alter the properties of the material formed in the structures. Examples of solvents suitable for this step include methyl ethyl ketone (MEK), high pH aqueous developers, and methyl cellosolve.

EXAMPLES

BUTVAR B-76—polyvinyl butyral resin, available from Solutia, Inc. (St. Louis, Mo.)

CAB-O-SIL M7D Fumed Silica—available from Cabot Corp. (Tuscola, Ill.)

Carbon Black Millbase—a mixture of 47.52% carbon black, 47.52% BUTVAR B-76, and 4.95% DISPERBYK 161

Compound I—1,4-Bis-(1-methylhexylamino)-5,8-dihydroxyanthraquinone, formed using the method described in U.S. Pat. No. 2,848,462 to Gutzwiller et al., with the structure labeled I, found below Compound II—1-Butylsulfonylamido-3-methyl-4-aminoathraquinone, formed using the method described in U.S. Pat. No. 4,977,134 to Jongewaard et al., with the structure labeled II, found below Compound III—Solvent Blue 101, available from DuPont (Wilmington, Del.) with the structure labeled III, found below Compound IV—A dye, formed using the method described in U.S. Pat. No. RE35,550 to Jongewaard et al., with the structure labeled IV, found below

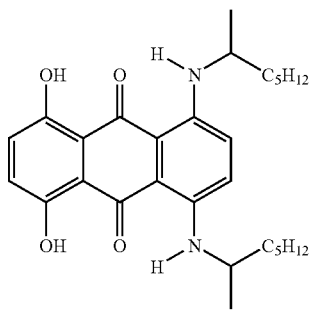

I

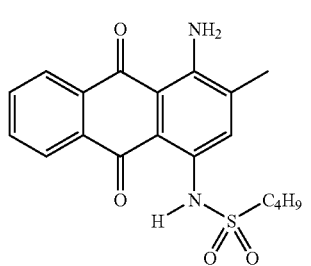

II

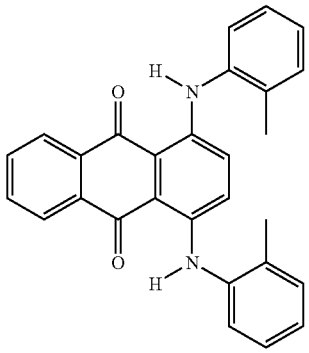

III

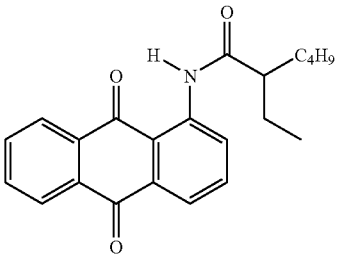

IV

DISPERBYK 161—available from BYK-Chemie USA (Wallingford, Conn.) as a 20% total solids solution in a 50:50 solvent mix of methyl ethyl ketone (MEK) and Solvent PM C99 IR Dye—infrared dye TXR-2900, available from Mitsui, USA (New York, N.Y.)

FC 55/35/10—a fluorocarbon made of a 55:35:10 ratio mixture of a terpolymer of a fluorinated acrylate, a short chain alkyl acrylate, and a polar monomer as a 7.5% total solids solution in MEK, available from 3M (St. Paul, Minn.)

FX 12—N-ethylperflourooctysulphonamide as a 50% total solids solution in MEK

HPA 1186—a dihydropyridine derivative available from St. Jean Photochemicals, Inc. (Quebec, Canada)

IR-165 dye—CYASORB infrared dye, available from Cytec Industries, Inc. (West Pateson, N.J.)

LUMILUX GREEN FF-G—a phosphorescent pigment available from Honeywell Corp. (Morristown, N.J.)

PC-364 IR Dye—an infrared dye, available from Honeywell Corp. (Morristown, N.J.) with the following structure

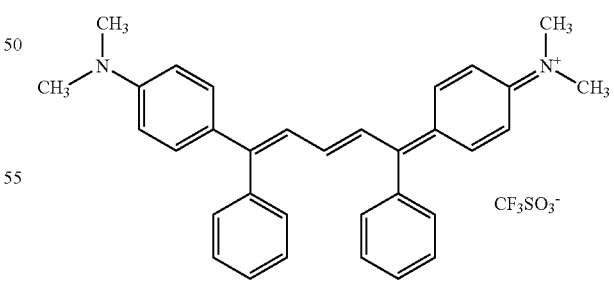

Red Shade Yellow Millbase—a mixture of 47.52% Red Shade Yellow pigment, 47.52% BUTVAR B-76, and 4.95% DISPERBYK 161, available from BYK-Chemie (Wallingford, Conn.) as a 15% total solids solution in a 50:50 solvent mix of MEK and Solvent PM Solvent PM—propylene glycol monomethyl ether, available from Eastman Chemicals, (Kingsport, Tenn.)

Violet Black Millbase—MICROLITH Violet B-K, available from Ciba Specialty Chemicals (Tarrytown, N.Y.), as a 10% total solids solution in MEK

Example 1

In this example, a structured surface was formed on a polyimide substrate using 830 nm infrared radiation. An ablatable radiation sensitive coating was formed by preparing a 9% total solids solution of the components listed in Table 1 in MEK. The solution was coated onto DUPONT HN polyimide substrate using a #12 wire wrapped bar. The resulting assembly was oven dried at 190 deg. F. for 2 minutes to form the ablatable radiation sensitive coating on the polyimide substrate.

TABLE 1

Components of coating used in Example 1

| Component | Percentage of solids |
|---|---|
| BUTVAR B-76 | 71.4% |
| PC-364 IR Dye | 14.3% |
| FX 12 | 14.3% |

The ablatable radiation sensitive coating was then imaged on a 830 nm laboratory test imager that used a 0.55 watt 830 nm fiber coupled diode manufactured by Presstek, Inc. (Hudson, N.H.) focused to a 25 micron spot. The coating was then imaged by spinning the coating and the substrate on a drum at 100-200 cm/sec past the focused laser beam. The imaged areas of the ablatable radiation sensitive coating ablated to produce 25 micron wide channels on the polyimide substrate.

Tetradecane was then applied to the structured surface by a syringe. The tetradecane wetted the structures and was repelled from the ablatable radiation sensitive coating that remained on the polyimide substrate.

Example 2

In example 2, a structured surface was formed on a polyimide substrate using 1065 nm infrared radiation. An ablatable radiation sensitive coating was formed by preparing a 9% total solids solution of the components listed in Table 2 in methyl ethyl ketone. The solution was coated onto DUPONT HN polyimide substrate using a #12 wire wrapped bar. The resulting assembly was oven dried at 190 deg. F. for 2 minutes to form the ablatable radiation sensitive coating on the polyimide substrate.

TABLE 2

Components of coating used in Example 2

| Component | Percentage of solids |
|---|---|
| BUTVAR B-76 | 71.4% |
| IR-165 dye | 14.3% |
| FX 12 | 14.3% |

The ablatable radiation sensitive coating was then imaged on a YAG nm laboratory test imager that used a 1.0 watt 1065 nm fiber coupled laser diode manufactured by Boston Laser Inc. (Boston, Mass.) focused to a 25 micron spot. The coating was imaged by spinning the substrate and coating on a drum at 100-200 cm/sec past the focused laser beam. The imaged areas of the ablatable radiation sensitive coating ablated to produce 25 micron wide channels on the polyimide substrate.

Tetradecane was then applied to the structured surface by a syringe. The tetradecane wetted the structures and was repelled from the ablatable radiation sensitive coating that remained on the polyimide substrate.

Example 3

In example 3, a structured surface was formed on a polyester substrate using 830 nm infrared radiation. An ablatable radiation sensitive coating was formed by preparing a 9% total solids solution of the components listed in Table 3 in MEK. The solution was coated onto DUPONT 574 polyester substrate using a #12 wire wrapped bar. The resulting assembly was oven dried at 190 deg. F. for 2 minutes to form the ablatable radiation sensitive coating on the polyester substrate.

TABLE 3

Components of coating used in Example 3

| Component | Percentage of solids |
|---|---|
| BUTVAR B-76 | 71.4% |
| PC-364 IR Dye | 14.3% |
| FX 12 | 14.3% |

The ablatable radiation sensitive coating was then imaged on an 830 nm laboratory test imager that used a 0.55 watt 830 nm fiber coupled diode manufactured by Presstek, Inc. (Hudson, N.H.) focused to a 25 micron spot. The coating was imaged by spinning the coating and the substrate on a drum at 100-200 cm/sec past the focused laser beam. The imaged areas of the ablatable radiation sensitive coating ablated to produce 25 micron wide channels on the polyester substrate.

Tetradecane was then applied to the structured surface by a syringe. The tetradecane wetted the structures and was repelled from the ablatable radiation sensitive coating that remained on the polyester substrate.

Example 4

In example 4, a structured surface was formed on a polyester substrate using 830 nm infrared radiation. An ablatable radiation sensitive coating was formed by preparing a 9% total solids solution of the components listed in Table 4 in MEK. The solution was coated onto DUPONT 574 polyester substrate using a #12 wire wrapped bar. The resulting assembly was oven dried at 190 deg. F. for 2 minutes to form the ablatable radiation sensitive coating on the polyester substrate.

TABLE 4

Components of coating used in Example 4

| Component | Percentage of solids |
|---|---|
| BUTVAR B-76 | 71.4% |
| IR-165 IR Dye | 14.3% |
| FX 12 | 14.3% |

The ablatable radiation sensitive coating was then imaged on an 830 nm laboratory test imager that used a 0.55 watt 830 nm fiber coupled diode manufactured by Presstek, Inc. (Hudson, N.H.) focused to a 25 micron spot. The coating was imaged by spinning the coating and the substrate on a drum at 100-200 cm/sec past the focused laser beam. The imaged areas of the ablatable radiation sensitive coating ablated to produce 25 micron wide channels on the polyester substrate.

Tetradecane was then applied to the structured surface by a syringe. The tetradecane wetted the structures and was repelled from the ablatable radiation sensitive coating that remained on the polyester substrate.

Example 5

In example 5, two structured surfaces were each formed on polyimide substrates using 830 nm infrared radiation. A first ablatable radiation sensitive coating was formed by preparing a 8.5% total solids solution of the components listed in Table 5(a) in a 10:1:1 solvent mix of MEK:Solvent PM:ethanol. This first solution was coated onto a DUPONT HN polyimide substrate using a #12 wire wrapped bar. The resulting assembly was oven dried to form the first ablatable radiation sensitive coating on the polyimide substrate at a coating weight of 150-200 mg/sq ft.

TABLE 5(a)

Components of first coating used in Example 5

| Component | Percentage of solids |
| --- | --- |
| Carbon Black Millbase | 31.9% |
| Violet Black Millbase | 8.1% |
| Red Shade Yellow Millbase | 5.0% |
| BUTVAR B-76 | 41.3% |
| D99 IR Dye | 10% |
| HPA-1186 | 1.6% |
| DISPERBYK 161 | 2.2% |

A second ablatable radiation sensitive coating was formed by preparing a 2.5% total solids solution of the components listed in Table 5(b) in a 10:1:1 solvent mix of MEK:Solvent PM:ethanol. This second solution was coated onto the first ablatable radiation sensitive coating substrate using a #6 wire wrapped bar. The resulting assembly was oven dried to form the second ablatable radiation sensitive coating on the first ablatable radiation sensitive coating at a coating weight of 15-30 mg/sq ft.

TABLE 5(b)

Components of second coating used in Example 5

| Component | Percentage of solids |
| --- | --- |
| BUTVAR B-76 | 75% |
| D-99 IR Dye | 18% |
| HPA-1186 | 1.5% |
| FX 12 | 5.5% |

The first and second ablatable radiation sensitive coatings were then imaged on an 830 nm laboratory test imager that used a 0.55 watt 830 nm fiber coupled diode manufactured by Presstek, Inc. focused to a 25 micron spot. The coating was imaged by spinning the coating and the substrate on a drum at 100-200 cm/sec past the focused laser beam. The imaged areas of the first and second ablatable radiation sensitive coatings ablated to produce a first structured surface that contained 25 micron wide channels on the polyimide substrate. This method was repeated to make a second structured surface that contained 25 micron wide channels on a polyimide substrate.

On the first structured surface, tetradecane was applied to the structured surface by a syringe. The tetradecane wetted the structures and was repelled from the ablatable radiation sensitive coating that remained on the polyimide substrate. On the second structured surface silver nano-ink consisting of conductive silver metal particles in a tetradecane solvent, by a syringe. The silver nano-ink flowed in the structures and was repelled from the ablatable radiation sensitive coating that remained on the substrate.

Example 6

In example 6, two structured surfaces were formed on polyimide substrates using two different imagers. A first structured surface precursor was formed using the following method. A first ablatable radiation sensitive coating was formed by preparing an 8.5% total solids solution of the components listed in Table 6(a) in a 10:1:1 solvent mix of MEK:Solvent PM:ethanol. This first solution was coated onto DuPont HN polyimide substrate using a #12 wire wrapped bar. The resulting assembly was oven dried to form the first ablatable radiation sensitive coating on the polyimide substrate at a coating weight of 150-200 mg/sq ft.

TABLE 6(a)

Components of first coating used in Example 6

| Component | Percentage of solids |
| --- | --- |
| Carbon Black Millbase | 31.9% |
| Violet Black Millbase | 8.1% |
| Red Shade Yellow Millbase | 5.0% |
| BUTVAR B-76 | 37.3% |
| IR-165 dye | 14% |
| HPA-1186 | 1.6% |
| DISPERBYK 161 | 2.2% |

A second ablatable radiation sensitive coating was formed by preparing a 2.5% total solids solution of the components listed in Table 6(b) in a 10:1:1 solvent mix of MEK:Solvent PM:ethanol. This second solution was coated onto the first ablatable radiation sensitive coating substrate using a #6 wire wrapped bar. The resulting assembly was oven dried to form the second ablatable radiation sensitive coating on the first ablatable radiation sensitive coating at a coating weight of 15-30 mg/sq ft.

This method was repeated for form a second structured surface precursor.

TABLE 6(b)

Components of second coating used in Example 6

| Component | Percentage of solids |
| --- | --- |
| BUTVAR B-76 | 75% |
| IR-165 dye | 18% |
| HPA-1186 | 1.5% |
| FX 12 | 5.5% |

The first and second ablatable radiation sensitive coatings of the first structured surface precursor were imaged on a CDI Spark imager, manufactured by Esko-Graphics, Inc. (Kennesaw, Ga.). The imaged areas of the first and second ablatable radiation sensitive coatings ablated to form the first structured surface containing 20 micron wide channels on the polyimide substrate.

The first and second ablatable radiation sensitive coatings of the second structured surface precursor were imaged on a YAG nm laboratory test imager that uses a 1.0 watt 1065 nm fiber coupled laser diode manufactured by Boston Laser Inc. (Boston, Mass.) focused to a 25 micron spot. The imaged areas of the first and second ablatable radiation sensitive coatings ablated to form the second structured surface containing 25 micron wide channels on the polyimide substrate.

Tetradecane was then applied to the first and the second structured surfaces by a syringe. The tetradecane wetted the structures on each structured surface and was repelled from the ablatable radiation sensitive coating that remained on the polyimide substrates.

Example 7

In example 7, a structured surface was formed on a polyester substrate using 830 nm infrared radiation. A first ablatable radiation sensitive coating was formed by preparing a 8.5% total solids solution of the components listed in Table 7(a) in a 10:1:1 solvent mix of MEK:Solvent PM:ethanol. This first solution was coated onto DUPONT 574 polyester substrate using a #12 wire wrapped bar. The resulting assembly was oven dried to form the first ablatable radiation sensitive coating on the polyester substrate at a coating weight of 150-200 mg/sq ft.

TABLE 7(a)

Components of first coating used in Example 7

| Component | Percentage of solids |
| --- | --- |
| Carbon Black Millbase | 31.9% |
| Violet Black Millbase | 8.1% |
| Red Shade Yellow Millbase | 5.0% |
| BUTVAR B-76 | 41.3% |
| D99 IR Dye | 10% |
| HPA-1186 | 1.6% |
| DISPERBYK 161 | 2.2% |

A second ablatable radiation sensitive coating was formed by preparing a 2.5% total solids solution of the components listed in Table 7(b) in a 10:1:1 solvent mix of MEK:Solvent PM:ethanol. This second solution was coated onto the first ablatable radiation sensitive coating substrate using a #6 wire wrapped bar. The resulting assembly was oven dried to form the second ablatable radiation sensitive coating on the first ablatable radiation sensitive coating at a coating weight of 15-30 mg/sq ft.

TABLE 7(b)

Components of second coating used in Example 7

| Component | Percentage of solids |
| --- | --- |
| BUTVAR B-76 | 75% |
| D-99 IR Dye | 18% |
| HPA-1186 | 1.5% |
| FX 12 | 5.5% |

The first and second ablatable radiation sensitive coatings were then imaged on a 830 nm laboratory test imager that uses a 0.55 watt 830 nm fiber coupled diode manufactured by Presstek, Inc. focused to a 25 micron spot. The coatings were imaged by spinning the coatings and the substrate on a drum at 100-200 cm/sec past the focused laser beam. The imaged areas of the first and second ablatable radiation sensitive coatings ablated to produce 25 micron wide channels on the polyester substrate.

Tetradecane was then applied to the structured surface by a syringe. The tetradecane wetted the structures and was repelled from the ablatable radiation sensitive coatings that remained on the polyester substrate.

Example 8

In example 8, a structured surface was formed on a polyester substrate using 1065 nm infrared radiation. A first ablatable radiation sensitive coating was formed by preparing a 8.5% total solids solution of the components listed in Table 8(a) in a 10:1:1 solvent mix of MEK:Solvent PM:ethanol. This first solution was coated onto DUPONT 574 polyester substrate using a #12 wire wrapped bar. The resulting assembly was oven dried to form the first ablatable radiation sensitive coating on the polyester substrate at a coating weight of 150-200 mg/sq ft.

TABLE 8(a)

Components of first coating used in Example 8

| Component | Percentage of solids |
| --- | --- |
| Carbon Black Millbase | 31.9% |
| Violet Black Millbase | 8.1% |
| Red Shade Yellow Millbase | 5.0% |
| BUTVAR B-76 | 37.3% |
| IR-165 Dye | 14% |
| HPA-1186 | 1.6% |
| DISPERBYK 161 | 2.2% |

A second ablatable radiation sensitive coating was formed by preparing a 2.5% total solids solution of the components listed in Table 8(b) in a 10:1:1 solvent mix of MEK:Solvent PM:ethanol. This second solution was coated onto the first ablatable radiation sensitive coating substrate using a #6 wire wrapped bar. The resulting assembly was oven dried to form the second ablatable radiation sensitive coating on the first ablatable radiation sensitive coating at a coating weight of 15-30 mg/sq ft.

TABLE 8(b)

Components of second coating used in Example 8

| Component | Percentage of solids |
| --- | --- |
| BUTVAR B-76 | 75% |
| IR-165 Dye | 18% |
| HPA-1186 | 1.5% |
| FX 12 | 5.5% |

The first and second ablatable radiation sensitive coatings were then imaged on a YAG nm laboratory test imager that used a 1.0 watt 1065 nm fiber coupled laser diode manufactured by Boston Laser Inc. (Boston, Mass.) focused to a 25 micron spot. The imaged areas of the first and second ablatable radiation sensitive coatings ablated to produce 25 micron wide channels on the polyester substrate.

Tetradecane was then applied to the structured surface by a syringe. The tetradecane wetted the structures and was repelled from the ablatable radiation sensitive coating that remained on the polyester substrate.

Example 9

In example 9, both a luminescent element and several color filters were made using structured surfaces that were formed on a polyester substrate using 830 nm infrared radiation. A first ablatable radiation sensitive coating was formed by preparing a solution of the components listed in Table 9(a). This is first solution was coated onto DuPont 574 polyester substrate using a #20 wire wrapped bar. The resulting assembly was oven dried at 100 deg. C. for 60 seconds to form the first ablatable radiation sensitive coating on the polyester substrate.

TABLE 9(a)

Components of first coating used in Example 9

| Component | Amount |
|---|---|
| PC 364 IR Dye | 178 mg |
| BUTVAR B-76 (10% total solids in MEK) | 30.0 g |
| CAB-O-SIL M7D Fumed Silica | 600 mg |
| MEK | 28.0 g |

A second ablatable radiation sensitive coating was formed by preparing a solution of the components listed in Table 9(b). This second solution was coated onto the first ablatable radiation sensitive coating substrate using a #8 wire wrapped bar. The resulting assembly was oven dried at 100 deg. C. for 60 seconds to form the second ablatable radiation sensitive coating on the first ablatable radiation sensitive coating at a coating weight of 15-30 mg/sq ft.

TABLE 9(b)

Components of second coating used in Example 9

| Component | Amount |
|---|---|
| BUTVAR B-76 (10% total solids in MEK) | 6.56 g |
| D-99 IR dye | 160 mg |
| FC 55/35/10 (7.5% total solids in MEK) | 230 mg |
| FX 12 (50% total solids in ethyl acetate) | 100 mg |
| MEK | 28 mg |

The first and second ablatable radiation sensitive coatings were then imaged on an 830 nm external drum imager, the DESERTCAT 88 imager, available from ECRM (Tewksbury, Mass.) imaging at a fluence setting of 1.5 Joules. The imaged areas of the first and second ablatable radiation sensitive coatings ablated to produce 20 micron wide channels on the polyester substrate. This process was repeated 6 times to form 7 separate structured surfaces.

A luminescent ink was prepared using the components listed in Table 9(c). This ink was mixed using a ROSS homogenizer for 30 minutes. The ink was then applied to the first structured surface using a syringe. The luminescent ink wetted the structures and was repelled from the ablatable radiation sensitive coating that remained on the polyester substrate.

TABLE 9(c)

Components of luminescent ink used in Example 9

| Component | Amount |
|---|---|
| LUMILUX GREEN FF-G | 5.0 g |
| Oleic acid | 5.0 g |
| Tetradecane | 20.0 g |

Six different inks were prepared using the components listed in Table 9(d). The inks were each applied to different structured surfaces using a syringe. Some structured surfaces had more than one ink applied to different channels on the structured surface. The inks wetted the structures and were repelled from the ablatable radiation sensitive coating that remained on the polyester substrate.

TABLE 9(d)

Components of inks used in Example 9

| Component | Amount |
|---|---|
| Component in ink 1 | |
| Compound I | 200 mg |
| Butyl acetate | 2.0 g |
| Tetradecane | 2.0 g |
| Component in ink 2 | |
| Compound II | 200 mg |
| Butyl acetate | 2.0 g |
| Oleic acid | 2.0 g |
| Component in ink 3 | |
| Compound III | 200 mg |
| Butyl acetate | 2.0 g |
| Tetradecane | 2.0 g |
| Component in ink 4 | |
| Compound IV | 200 mg |
| Butyl acetate | 2.0 g |
| Oleic acid | 2.0 g |
| Component in ink 5 | |
| Compound I | 100 mg |
| Compound III | 100 mg |
| Butyl acetate | 2.0 g |
| Tetradecane | 2.0 g |
| Component in ink 6 | |
| Compound I | 100 mg |
| Compound IV | 100 mg |
| Butyl acetate | 2.0 g |
| Oleic acid | 2.0 g |

Comparative Example 10

In example 10, a MATCHPRINT DIGITAL HALFTONE DONOR and MATCHPRINT DIGITAL HALFTONE RECEPTOR, each available from Kodak Polychrome Graphics (Norwalk, Conn.) were imaged using a transfer method to produce structures on the receptor. The donor was imaged on an 830 nm external drum imager, the DESERTCAT 88 imager, available from ECRM (Tewksbury, Mass.) imaging at a fluence setting of 0.4 Joules to form channels framed by separation banks on the receptor.

In example 11, a structured surface was formed using the inventive method described in example 3.

The structures formed in example 11 contain less visible debris than the structures formed in comparative example 10 in which a transfer method was used. The separation banks formed in example 11 also exhibit sharper, straighter, edges than the separation banks formed in comparative example 10.

Example 12

In example 12, a structured surface was formed on a polyester substrate using the method described in Example 7 to form 25 micron wide channels. A drop of tetradecane was then applied to the structured surface by a syringe. The distance that the tetradecane had traveled through the 25 micron wide channels was measured at specific time intervals. These results are found in Table 12.

TABLE 12

| Time required for tetradecane to flow through channels formed in example 12 | |
|---|---|
| Time (in seconds) | Distance |
| 2 sec. | 0.5 mm |
| 5 sec. | 1.2 mm |
| 10 sec. | 2.0 mm |
| 20 sec. | 3.5 mm |
| 30 sec. | 4.0 mm |

Example 13

In example 13, a structured surface was formed on a polyester substrate using the method described in Example 9 to form 25 micron wide channels. A drop of tetradecane was then applied to the structured surface by a syringe. The distance that the tetradecane had traveled through the 25 micron wide channels was measured at specific time intervals. These results are found in Table 13.

TABLE 13

| Time required for tetradecane to flow through channels formed in example 13 | |
|---|---|
| Time (in seconds) | Distance |
| 2 sec. | 0.8 mm |
| 5 sec. | 2.5 mm |
| 10 sec. | 3.5 mm |
| 20 sec. | 5.5 mm |
| 30 sec. | 7.0 mm |

These results indicate that tetradecane wetted the channels formed in Example 13 more quickly than the channels formed in Example 12. This is believed to result from the fumed silica that was included in the first layer of Example 13.

The invention claimed is:

1. A method of forming a structured surface on a substrate comprising the steps of:
   (a) applying an ablatable radiation sensitive coating to a major surface of a substrate; and
   (b) patternwise exposing the ablatable radiation sensitive coating to radiation such that exposed portions of the ablatable radiation sensitive coating ablate to form structures framed by at least one separation bank on the substrate wherein the at least one separation bank is able to contain a flowable material in the structures, further comprising the step of depositing a flowable material onto the structures and onto the at least one separation bank to form a first intermediate assembly comprising a pattern of flowable material contained in the structured surface, further comprising the step of removing the separation banks to form a finished article.

2. The method of claim 1, further comprising the step of heating the first intermediate assembly to form a second intermediate assembly comprising a pattern of non-flowable material in the structures.

3. The method of claim 1, wherein the step of heating comprises placing the first intermediate assembly in an oven heated to between about 100° C. and about 200° C. for between about 10 minutes and about 60 minutes.

4. The method of claim 1, wherein the second intermediate assembly comprises a flexible circuit board.

5. The method of claim 4, further comprising the step of removing the separation banks to form a finished article.

* * * * *